United States Patent
Tiburtius et al.

(10) Patent No.: US 6,323,418 B1
(45) Date of Patent: *Nov. 27, 2001

(54) ELECTRICALLY SCREENING HOUSING

(76) Inventors: Bernd Tiburtius, Rosenhag 10, D-14532 Kleinmachnow (DE); Helmut Kahl, Horstwalder Str. 23, D-12307 Berlin (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/101,877
(22) PCT Filed: Jan. 20, 1997
(86) PCT No.: PCT/DE97/00121
§ 371 Date: Jul. 20, 1998
§ 102(e) Date: Jul. 20, 1998
(87) PCT Pub. No.: WO97/26782
PCT Pub. Date: Jul. 24, 1997

(30) Foreign Application Priority Data

Jan. 19, 1996 (DE) ............................................. 196 03 161

(51) Int. Cl.[7] ........................................ H05K 9/00
(52) U.S. Cl. ............... 174/35 R; 361/752; 361/753; 361/799; 361/800; 361/816; 361/818; 174/35 MS; 174/35 GC; 174/52.4; 29/729
(58) Field of Search .................... 174/35 R, 52.4, 174/35 MS, 35 GC; 361/752, 753, 799, 800, 816, 818; 29/729

(56) References Cited

U.S. PATENT DOCUMENTS

| | | | |
|---|---|---|---|
| 3,555,168 | * 1/1971 | Frykberg | 174/35 |
| 4,857,668 | * 8/1989 | Buonanno | 174/35 GC |
| 5,008,485 | * 4/1991 | Kitagawa | 174/35 GC |
| 5,708,720 | * 1/1998 | Meyer | 381/69 |
| 5,731,963 | * 3/1998 | Heiss et al. | 361/814 |
| 5,847,317 | * 12/1998 | Phelps | 174/35 R |

FOREIGN PATENT DOCUMENTS

| | | |
|---|---|---|
| 3812943A1 | 11/1989 | (DE). |
| 4333756A1 | 4/1994 | (DE). |
| 0629114B1 | 12/1994 | (EP). |
| 0654962A1 | 5/1995 | (EP). |
| 0676340A1 | 10/1995 | (EP). |
| WO91/01079 | 1/1991 | (WO). |

OTHER PUBLICATIONS

"Kunststoffgehause und EMV", published in Elektronik Industrie 3, 1992, p. 42.

* cited by examiner

Primary Examiner—William A. Cuchlinski, Jr.
Assistant Examiner—Ronnie Mancho
(74) Attorney, Agent, or Firm—Venable; George H. Spencer; Allen Wood

(57) ABSTRACT

The invention concerns an electrical screening housing for accommodating components or assemblies which emit electromagnetic radiation or are sensitive thereto, and for providing electromagnetic screening for the components or assemblies. The housing includes at least two parts with electrically screening walls, a sealing element being provided in an adhesive manner on at least one housing part in the region of a joint with the other housing part. The sealing element and at least one portion of the housing part bearing the latter are made of substantially non-conductive material and, for electromagnetic screening purposes, are covered with a cohesive, electrically conductive layer which extends at least over the entire width of the joint and adheres to the joint element and the housing part.

23 Claims, 4 Drawing Sheets

ELECTRICALLY SCREENING HOUSING

BACKGROUND OF THE INVENTION

The invention relates to an electrically screening housing for accommodating and electromagnetically screening assemblies which emit electromagnetic radiation, according to the preamble of claim 1.

It is known to make electrically screening housings from electrically non-conductive material, particularly plastic, by coating the prefabricated housing parts with a conductive material, e.g. by spraying them with conductive lacquer or applying aluminium by vapour deposition (cf. "Kunststoffgehause und EMV", elektronikindustrie 3—1992, p. 42). Such housings were generally provided with prefabricated seals made of conductive elastomer which were put in place during assembly. DE 38 12 943 A1 discloses an internally coated screening housing of fibre-reinforced plastic with a prefabricated seal of this kind placed between the groove and tongue.

Housings of the type described above—which have achieved particularly marked economic significance with the rapid proliferation of mobile telephones—are also known from EP 0 629 114 B1 and EP 0 654 962 A1.

The housings described therein are made up of two parts which consist of electrically conductive material or are coated with such for the purpose of electrically screening the inside of the housing (at least in parts) and in the assembled state form a Faraday cage. For electromagnetically screening the housing in the area of the joint between the adjoining housing parts there is also a screening seal which consists of an electrically conductive and at the same time elastic material and adapts to surface tolerances and unevenness, so that a very high quality screening of the inside of the housing can be ensured even with large-scale mass production. According to the specifications referred to above, this screening seal is produced directly on at least one of the housing parts, whilst an additional carrier may also be included in the construction.

By virtue of this construction the housing is easy to open, e.g. for maintenance purposes or for changing a battery in the housing, and is easily resealed afterwards whilst retaining the screening effect.

However, when producing a material for the screening seal, it is difficult for certain applications to achieve the best possible compromise between high elasticity, high conductivity and lowest possible material costs. A material which is advantageous from the physical point of view is a plastics composition filled with a high proportion of silver powder, but this is relatively expensive.

SUMMARY OF THE INVENTION

The aim of the invention is therefore to provide an electrically screening housing of the type mentioned hereinbefore which is cheap to manufacture.

In order to reduce costs, the present invention teaches that the screening seal is not made entirely from an electrically conductive flexible material, but rather that the joints be filled on site using a substantially electrically non-conductive ductile (elastic) element. The electrical screening in the joint area join by a further layer of electrically conductive material adhering to the substantially electrically non-conductive ductile element which is merged into the screening of the substantially rigid walls of the housing.

The sealing element primarily has the function of filling the interstice of the joint so as, for example, to reliably protect the inside of the housing from moisture and dust, in the event of any mechanical play between the housing parts caused by manufacturing errors or surface unevenness, and to prevent relative movements between the housing parts. As a result of the improved mechanical properties of the sealing mass it is thus possible to provide a durable hermetic seal for the inside of the housing. At the same time the sealing element provides part of the electromagnetic screening and ensures that it is sealed. It is particularly advantageous in this respect to use a high-grade elastic material and/or a flexibly shaped seal by means of which a prestress is built up between the housing parts during the assembly of the housing parts by the compression and/or bending of the sealing element, capable of preventing the undoing of a screw or clamp connection. However, the invention is not restricted to the use of carrier elements which are elastic by their material and/or shape, but can in principle also be performed with a plastically deformable sealing element.

In the preferred embodiment of the invention, the covering consisting of electrically conductive material is applied cohesively (and particularly in a single operation) to the surface of the sealing element and the rigid housing wall.

In another alternative embodiment of the invention the screening is of a sandwich construction, and the carrier element consists of at least two layers of electrically. non-conductive but flexible material between which is provided the layer of electrically conductive material which brings about the electromagnetic screening. The arrangement of the layer of electrically conductive material in a substantially deformation-free area between two deformable layers or strips of the elastic element advantageously counteracts cracking in the electrically conductive material, which is particularly important for constructions in which severe deformation of the screening element is supposed to occur or may occur when the housing parts are put together.

In another advantageous embodiment, it is proposed that the layer of electrically conductive material be made very thin in order to prevent cracking, since the bending stresses and hence the tendency to cracking increase as the layer thickness increases for a given amount of bending. The thickness of the layer of electrically conductive material is therefore substantially less (preferably by one to three orders of magnitude) than the width of the joint.

The application of the screening layer to the sealing element or—in the case of a sandwich construction—to one layer or strip thereof may be effected by various methods. Suitable methods of achieving uniform layer thicknesses are the processes known per se of spraying with conductive lacquer or spraying with a pure metal, but particularly galvanic metallisation and the processes of gas phase deposition (known especially from the manufacture of electronic components) such as sputtering and CVD (chemical vapour deposition).

In an advantageous embodiment, within the scope of the processes mentioned above, the coating is produced by the controlled growth of crystallites in accordance with the structurally predetermined directions of mechanical stressing of the substrate (especially the sealing element). Small lamellar surface elements may be formed on the surface—particularly in a multilayered structure—which cohere only loosely within the layer and are thus movable relative to one another to some extent during bending of the carrier element, which also counteract any cracking in the screening layer. It is particularly favourable if said crystallites are arranged in the manner of scales or roof-tiles, which can be achieved by angled spraying or sputtering of a suitable substrate with an appropriate choice of the coating parameters, i.e. apart from the orientation of the substrate, the substrate temperature, the flow rate of the gas, etc.

In another alternative embodiment of the invention the application of the electrically conductive layer to the carrier element is not carried out in the mechanically tension-free state but in a state of predetermined compression and/or bending of the sealing element. This ensures that cracking in the electrically conductive layer does not lead to a reduction in the electromagnetic screening action of the screening element. In this embodiment, the invention starts from the idea that cracking in the electrically conductive layer is difficult to prevent under all circumstances owing to the deformation of the screening element which occurs during the assembly of the housing, which means that it is important to minimise the negative effects of such cracking on the electromagnetic screening characteristics. As a result of the application of the electrically conductive layer in the deformed state of the sealing element cracks may possibly form subsequently when the tension is released, and these are substantially closed up again during the later deformation of the sealing element caused by the assembly of the housing, as the sealing element will then assume substantially the same form as it does during the application of the conductive layer.

Other advantageous features are recited-in the subordinate claims or described more fully hereinafter together with the description of the preferred embodiment of the invention, with reference to the drawings, wherein:

DESCRIPTION OF THE PREFERRED EMBODIMENTS

Figure 1:
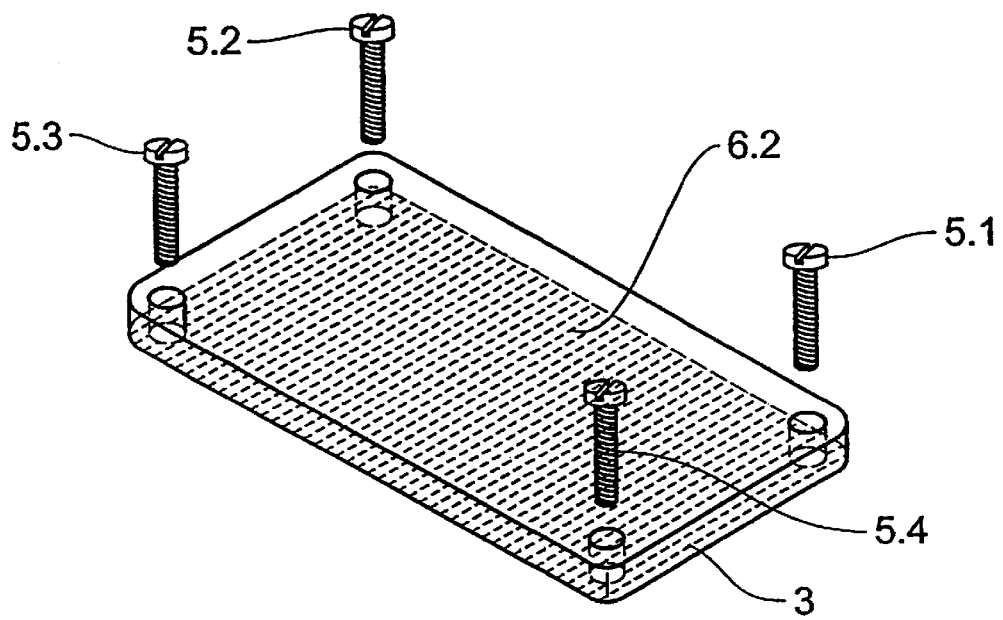
FIG. 1 shows, as a preferred embodiment of the invention, a housing made up of two housing parts for electromagnetically screening an electronic circuit, shown in exploded view.

FIG. 1 shows a housing 1 for an electronic circuit C which screens said circuit electromagnetically. On the one hand this prevents the circuit C from suffering interference from electromagnetic radiation coming in from outside, so that the circuit 1 can operate even in conditions subject to serious electromagnetic interference. On the other hand, the screening may prevent the electromagnetic radiation produced during operation from coming out of the housing, which might cause interference in the environment or present the possibility of unauthorised knowledge of functions occurring in the circuit.

The housing consists of a tub-shaped lower part 2 having a rectangular cross section of opening and a plate-shaped cover 3 for closing off the lower part 2 and comprises a seal 4 formed directly ("dispensed") on the lower part 2 to seal the joint between the lower part 2 and the cover 3. The cover 3 is attached to the lower part 2 by screwing, with four screws 5.1 to 5.4 passing through corresponding bores in the corners of the cover 3 and screwed into screw threads in the lower part 2.

Both the lower part 2 and the cover 3 are injection moulded from plastics, and all the inner surfaces—including the surface of the fitted seal, 4—are provided with a conductive coating 6.1 or 6.2 (which is cohesive for each housing part). The coatings 6.1 and 6.2 are in electrical contact with one another when the housing 1 is screwed together, and form an electromagnetic screening Faraday cage.

Figure 2B:
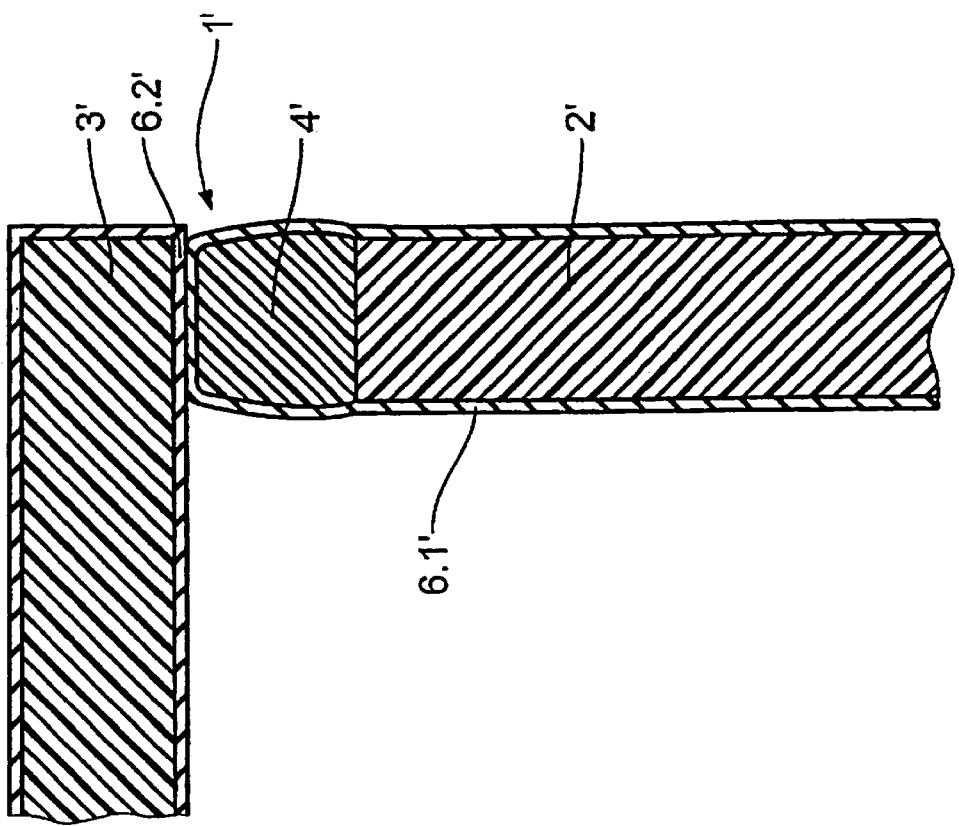
FIGS. 2a and 2b are cross sections through a part of the wall of the housing in FIG. 1 in the region of the joint between the housing parts according to two different embodiments.
Figure 2A:
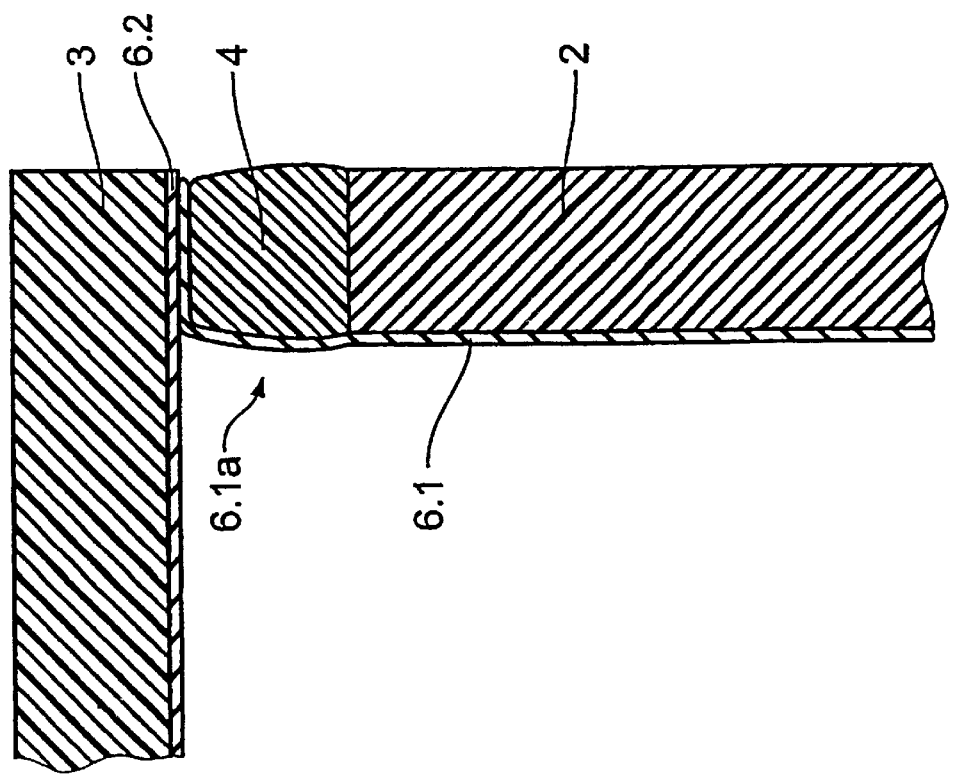
Figure 4A:
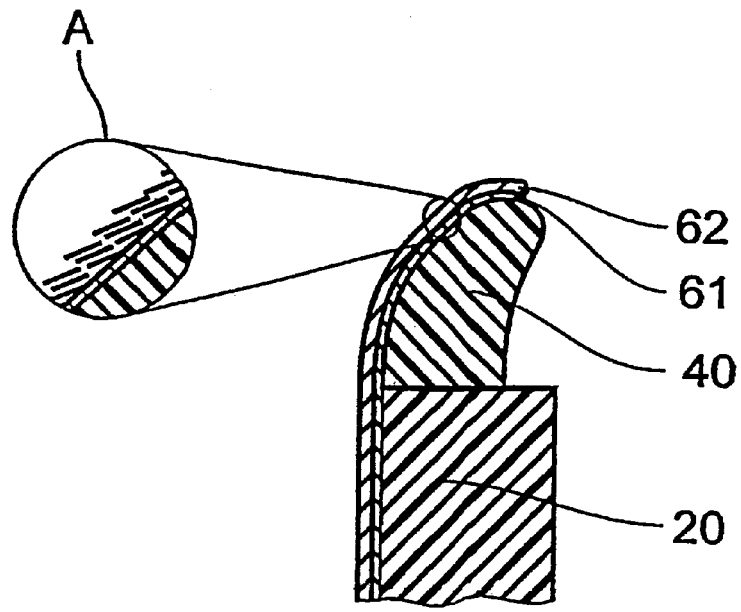
FIGS. 4a and 4b show a cross sectional view of a housing portion in another embodiment (a) with the sealing element tension-free and (b) with the housing in the assembled state.
Figure 4B:
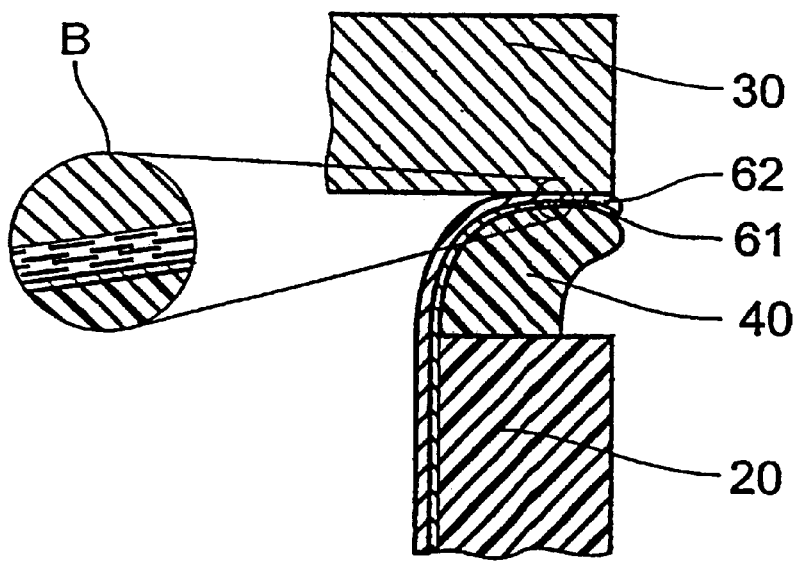

Thus, as is apparent from the cross sectional view shown in FIG. 2a, the screening seal consists of a resilient sealing element 4 made of a conventional elastic plastics material (such as unfilled silicon or neoprene) adhesively attached to the lower part 2, and the associated portion 6.1a of the conductive coating 6.1 (e.g. of sprayed on aluminium, copper or Cr—Ni or a one- or multi-component galvanic coating). As shown in FIGS. 4a and 4b, a layer of adhesion promoter known per se but matched in its physical, properties to the resilient sealing material may also be provided.

FIG. 2b shows as a housing 1', a modification of the housing in which both housing 1, parts 2', 3' have a galvanic coating 6.1' or 6.2' all over them, and enclose a substantially electrically non-conductive ductile sealing element 4' previously pressed onto the lower part 2. The sealing element 4' is adhered and hardened to the lower part 2' by the flow of air or by hot vulcanisation.

In another modification (not shown) the seal is extruded, together with one of the housing parts, from two different polymers, the monomers used being matched particularly in terms of the extrusion parameters and their thixotropic qualities as well as the temperature and rate of cross-linking.

Figure 3:
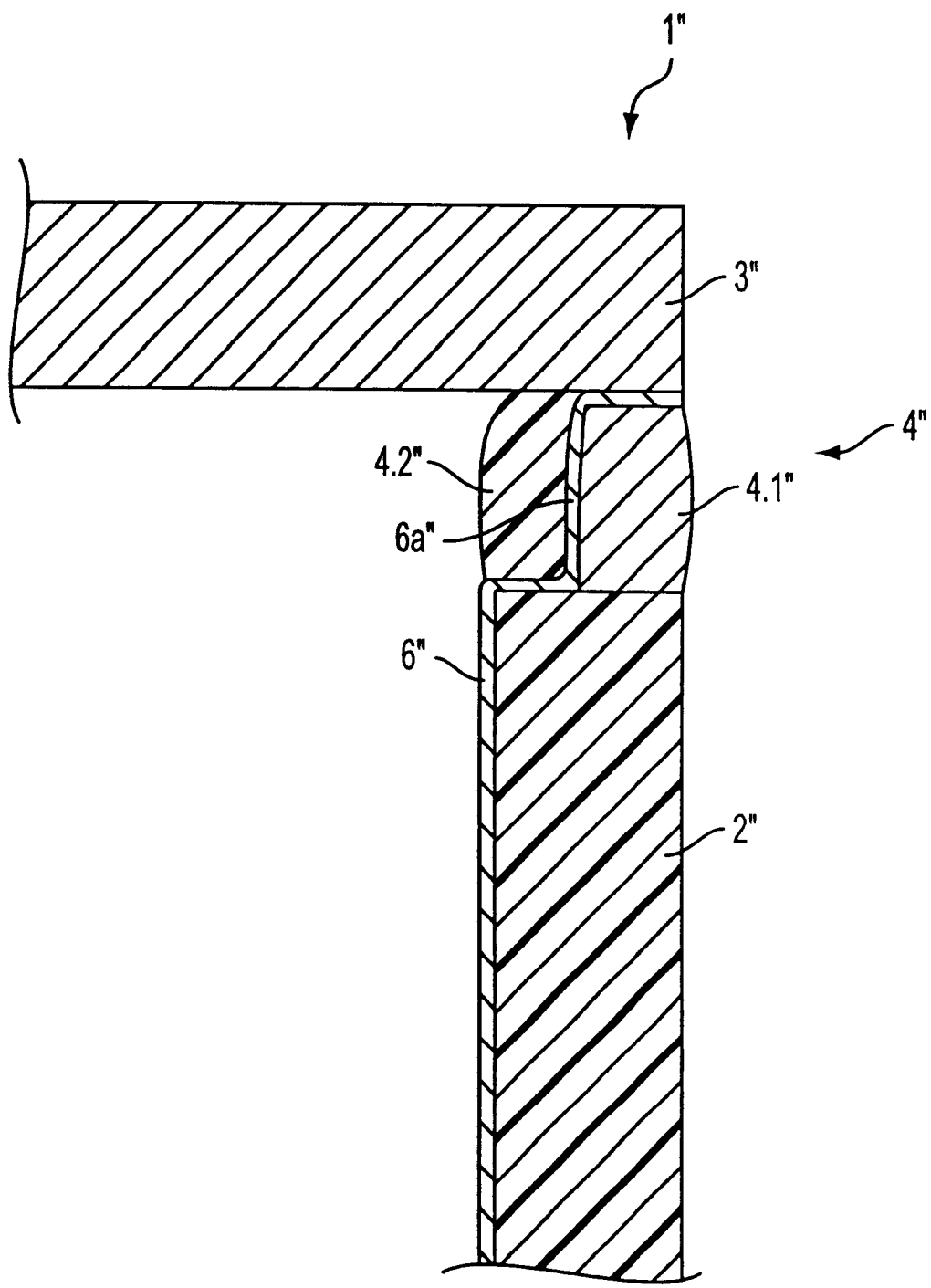
FIG. 3 shows another embodiment of the housing in FIG. 1, again viewed in cross section.

FIG. 3 shows as another embodiment a housing 1" which externally resembles the housing in FIG. 1, and which also has a lower part 2" consisting of an extrusion moulded plastic material, but the cover 3" of which is made from solid aluminium sheet. Therefore, there is only a metal coating 6" on the lower part. This coating also covers a sealing strip 4.1" mounted in the region of the outer surface of the lower part. A second sealing strip 4.2" is mounted close to the inner edge of the lower part in a separate application step after the application of the metal layer completes the seal 4". The seal thus has a sandwich structure in which the conductive coating is substantially freed from the tensile forces resulting from the deformation of the seal as the housing is closed and therefore the risk of cracking in the screening layer is largely eliminated. The arrangement of the conductive section 6a" of the layer in the centre between the two strips 4.1", 4.2" of the sealing element is advantageous inasmuch as the mechanical bending stress of the coating in this case is minimal under the monaxial compressive stress which occurs as the housing is screwed together, thereby reducing the danger of cracking. Cracking is made even more unlikely by the mechanical fixing of the electrically conductive layer between the two layers of the sealing element.

This objective can be achieved—at least to a certain extent—in the simpler structures of FIGS. 2a and 2b by keeping the thickness of the metal coating to a minimum compared with the dimensions of the seal. Depending on the size of the housing, the manufacturing tolerances which have to be taken into consideration and the screening action required, it may advantageously be fixed at as little as a few tens of microns or even just a few microns. This also shortens the process—particularly when producing a very pure and, advantageously, highly conductive layer by a vapour or vacuum process—and reduces the costs.

A special layered structure with a-reduced tendency to cracking is-shown in FIGS. 4a and 4b (in the tension-free state and in the assembled and hence deformed state, respectively).

Here, a lower housing part 20 as well as a lip-like elastic sealing element 40 comprises an adhesion-promoting layer 61 and a metallic coating 62, the latter being produced, for example, by the oriented growth of crystallites on the surface in a vacuum process. The crystal growth is controlled so that, on the surface of at least the sealing element 40, small scale-like surface elements are formed which overlap with one another to cover the surface almost completely and are movable relative to one another to some extent (cf. the enlarged diagrammatic detail "A" in FIG. 4*a*). This prevents the electrically conductive coating 62 from tearing apart when the housing is assembled as a result of the deformation of the seal 40 caused by assembly, which would lead to a deterioration in the electromagnetic screening action. Rather, the layer elements are monaxially oriented in an overlapping manner under the pressure of the metal cover 30 and the action of the tensile force resulting from the bending of the cross sectional profile when the cover is closed, and form a continuous layer (cf. detail "B" in FIG. 4*b*).

The lip-like shape of the sealing element 40 which is subjected primarily to bending stress during the assembly—as shown in FIG. 4*b*—is specially chosen in view of the structure of the layer 62 mentioned above. This layer structure does, however, develop a similarly beneficial effect on a substantially circular or semicircular sealing profile subjected primarily to compression, since once again the circumference will be enlarged as a result of the deformation, and the scale-like structure expanded as a result will then ensure that the coating remains sealed even in the assembled position of the housing.

The invention is not restricted in practice to the preferred embodiments described above. Rather, a number of alternatives are possible, making use of the solution described even if the embodiments are of a fundamentally different nature.

Thus, simply put, a thin lip C-shaped sealing element 40 (as shown in cross-section in FIG. 4*a*)may be formed on the lower housing part 20 by injection moulding. The combination of the thin lip C-shaped sealing element 40 with the lower housing part 20 acts as both the sealing means and the gap screening means, by virtue of its elasticity of shape. The combination of the sealing element 40 and the housing part 20 is covered with an adhesion promoting layer 61 and a scale-lie metallic coating 62. The sealing element or lip 40 may be formed integrally with the lower housing part 20.

What is claimed is:

1. An electrically screening housing for accommodating and providing electromagnetic screening of a component or module that emits electromagnetic radiation or that is sensitive to electromagnetic radiation, said housing comprising:

a first housing part having means for electromagnetic shielding;

a second housing part made of plastic material; and a first sealing element disposed between the first and second housing parts, the first sealing element being connected to the second housing part and being made of a material that is essentially non-conductive electrically, the first sealing element and second housing part forming a unitary structure that abuts the first housing part at a joint, wherein the unitary structure additionally includes a second sealing element that is disposed adjacent the first sealing element, and an electrically conductive coating that extends at least over the joint and that adheres to the first sealing element and the second housing part, and wherein the conductive coating additionally extends between the first and second sealing elements.

2. The housing of claim 1, wherein the second housing part has a thickness, and wherein the electrically conductive coating has a thickness that is substantially less than the thickness of the second housing part.

3. The housing of claim 2, wherein the electrically conductive coating comprises a thin metal layer.

4. The housing of claim 2, wherein the electrically conductive coating comprises a thin metal-filled layer.

5. The housing of claim 1, wherein the second housing part has an inner surface, and wherein the electrically conductive coating covers substantially all of the inner surface of the second housing part.

6. The housing of claim 1, wherein the electrically conductive coating is applied using a process selected from the group consisting of spray-coating, galvanizing, coating with the aid of vacuum, and chemical vapor deposition.

7. The housing of claim 1, wherein the electrically conductive coating is a composite material comprising a plurality of plate-shaped elements.

8. The housing of claim 7, wherein the plate-shaped elements overlap.

9. The housing of claim 7, wherein the sealing element is deformable, and wherein the plate-shaped elements are movable relative to each other during deformation of the sealing elements.

10. The housing of claim 7, wherein the second housing part has an inside surface, and wherein the electrically conductive coating covers substantially all of the inside surface of the second housing part.

11. The housing of claim 7, wherein the second housing part has an outside surface, and wherein the electrically conductive coating covers substantially all of the outside surface of the second housing part.

12. The housing of claim 1, wherein the first housing part comprises an injection-molded plastic member, and wherein the second housing part is also injection-molded.

13. The housing of claim 1, wherein the first housing part comprises electrically conductive material.

14. The housing of claim 1, wherein the sealing elements are elongated and resilient.

15. A method for producing an electrically screening housing for accommodating and providing electromagnetic screening of a component or module that emits electromagnetic radiation or that is sensitive to electromagnetic radiation, the housing including a first housing part having means for electromagnetic shielding, a second housing part made of plastic material, and a sealing element disposed between the first and second housing parts, the sealing element being connected to the second housing part and being made of a material that is essentially non-conductive electrically, the sealing element and second housing part forming a unitary structure that abuts the first housing part at a joint, the unitary structure additionally including an electrically conductive coating that extends at least over the joint and that adheres to the sealing element, said method comprising the steps of:

molding the second housing part;

forming the sealing element on an edge region of the second housing part;

applying the conductive coating to the second housing part and the sealing element; and joining the first housing part and the unitary structure, wherein the sealing element is not formed from the same type of plastic material that the second housing part is molded from, and wherein the steps of molding the second housing part and forming the sealing element are conducted simultaneously in a single-stage injection-molding process.

16. The method of claim 15, wherein the step of forming the sealing element comprises depositing a paste-like mass on the edge region of the second housing part and allowing the paste-like mass to harden.

17. The method of claim 15, wherein the sealing element is formed from the same type of plastic material from which the second housing part is molded.

18. A method for producing an electrically screening housing for accommodating and providing electromagnetic screening of a component or module that emits electromagnetic radiation or that is sensitive to electromagnetic radiation, the housing including a first housing part having means for electromagnetic shielding, a second housing part made of plastic material, and a sealing element disposed between the first and second housing parts, the sealing element being connected to the second housing part and being made of a material that is essentially non-conductive electrically, the sealing element and second housing part forming a unitary structure that abuts the first housing part at a joint, the unitary structure additionally including an electrically conductive coating that extends at least over the joint and that adheres to the sealing element, said method comprising the steps of:

molding the second housing part;

forming the sealing element on an edge region of the second housing part;

applying the conductive coating to the second housing part and the sealing element; and joining the first housing part and the unitary structure, wherein the sealing element has a predetermined shape after the forming step is conducted, and wherein the method further comprises the step of deforming the shape of the sealing element before the step of applying the conductive coating is conducted.

19. The method of claim 18, wherein the step of forming the sealing element comprises depositing a paste-like mass on the edge region of the second housing part and allowing the paste-like mass to harden.

20. The method of claim 18, wherein the sealing element is formed from the same type of plastic material that the second housing part is molded from.

21. The method of claim 15, wherein the step of applying the conductive coating is conducted with the aid of a coating process selected from the group consisting of spray-coating, galvanizing, vapor-deposition, and sputtering.

22. The method of claim 15, wherein the step of applying the conductive coating is conducted with the aid of a coating process selected from the group consisting of vapor deposition and sputtering, and wherein the coating process is conducted at an angle to the surface that is being coated so as to produce a conductive coating with a scaled structure.

23. The method of claim 18, wherein the deformed shape of the sealing element before the step of applying the conductive coating is conducted is substantially the same as the shape that the sealing element has after the electrically screening housing is assembled.

* * * * *